United States Patent [19]

Jang

[11] Patent Number: 5,796,675
[45] Date of Patent: Aug. 18, 1998

[54] SYNCHRONOUS MEMORY DEVICE HAVING DUAL INPUT REGISTERS OF PIPELINE STRUCTURE IN DATA PATH

[75] Inventor: Seong Jun Jang, Kyoungkido, Rep. of Korea

[73] Assignee: Hyundai Electrics Industries Co., Ltd., Kyoungkido, Rep. of Korea

[21] Appl. No.: 796,219

[22] Filed: Feb. 7, 1997

[30] Foreign Application Priority Data

Feb. 8, 1996 [KR] Rep. of Korea ............... 1996-3078

[51] Int. Cl.$^6$ ........................................ G11G 8/00
[52] U.S. Cl. ............... 365/230.08; 365/233; 365/240
[58] Field of Search .................. 365/230.08, 230.06, 365/184.05, 240, 189.12, 233, 230.02

[56] References Cited

U.S. PATENT DOCUMENTS

| | | | |
|---|---|---|---|
| 4,821,226 | 4/1989 | Christopher et al. | 364/900 |
| 4,933,909 | 6/1990 | Cushing et al. | 365/230.02 |
| 5,018,109 | 5/1991 | Shinoda et al. | 365/230.08 |
| 5,305,282 | 4/1994 | Choi | 365/230.08 |
| 5,331,601 | 7/1994 | Parris | 365/230.08 |
| 5,629,896 | 5/1997 | McClure | 365/230.08 |

*Primary Examiner*—Tan T. Nguyen
*Attorney, Agent, or Firm*—Jacobson, Price, Holman & Stern, PLLC

[57] ABSTRACT

The present invention discloses a synchronous memory device capable of processing data at a high speed in a read path of the memory device, by decreasing the timing margin of the external clock signal which is input into the input registers, of the pipeline structure the memory device comprises: a) an address pad receiving an address signal; b) a first input register coupled to the address pad, wherein the first input registers including:, 1) a first switching device coupled to the address pad, wherein the first switching device is controlled by a first control signal; 2) a first latch device for storing the address signal from the first switching device; and 3) a second switching device coupled to the first latch device, wherein the second switching device is controlled by a second control signal, and wherein-the second control signal is 180° out of phase from the first control signal; c) a second input register coupled to the first input register in parallel, wherein the second input.registers including: 1) a third switching device coupled to the address pad, wherein the third switching device is controlled by the second control signal; 2) a second latch device for storing the address signal from the third switching device; and 3) a fourth switching device coupled to the second latch device, wherein the fourth switching device is controlled by the first; d) an inverting device for output from the second switching device; and e) a decoding means for decoding the output from the inverting means.

8 Claims, 5 Drawing Sheets

SYNCHRONOUS MEMORY DEVICE HAVING DUAL INPUT REGISTERS OF PIPELINE STRUCTURE IN DATA PATH

BACKGROUND OF THE INVENTION

1. Field of the Invention

The present invention relates to a memory device and more particularly to a synchronous memory device having a pipeline structure in a data read path to transmit information at a high speed in very large scaled integrated circuits (VLSI).

2. Description of the Prior Art

In general, a conventional synchronous memory device has used an input register which receives input address and stores input data corresponding to the input address FIG. 1 is a schematic view showing the configuration of an input part of a conventional memory device.

The input part includes an address (ADD) pad 1 to receive address signal, an input buffer 2 to transmit the input addresses to an internal circuit, an input register 3 which transmits the output data from the input buffer 2 to a decoder in response to synchronous pulse signals, a decoder 5 to decode the output from the input register 3, and a word line selector 6 to receive the output from the decoder 5 and select memory cells.

The input register 3 includes two multiplexers MUX1 and MUX2 and two latch circuits L1 and L2. As a switching device, the multiplexer MUX1 consists of a PMOS transistor P100 and an NMOS transistor N99 which are, respectively, turned on and by the synchronous pulse signal /CK1, using an inverter I101. Similarly, the multiplexer MUX2 consists of a PMOS transistor P107 and an NMOS transistor N106 which are, respectively, turned on and off by the synchronous pulse signal /CK2, using an inventor I108.

FIG. 2 is a schematic view showing the clock signal generator producing the synchronous pulse signals which control the multiplexers in FIG. 1. As shown in FIG. 2, the synchronous pulse signals: /CK1 and /CK2 are generated by a clock generator, using an external clock signal K. The clock generator includes a NAND gate, an OR gate and a plurality of inverters. An NAND gate NAND1 has two input terminals, one of which receives the external clock signal K and the other of which receives the inverted clock signal K through a plurality of inverters I9 to I13. An inverter I20 receives the output from the NAND gate NAND1 and generates the synchronous pulse signal /CK1.

An NOR gate NOR1 also has two input terminals, one of which receives the external clock signal K delayed by a plurality of inverters I14 to I18 and the other of which receives the inverted clock signal K through a plurality of inverters I14 to I16. An inverter I26 receives the output from the NOR gate NOR1 and generates the synchronous pulse signal /CK2.

FIG. 3 is a signal waveform chart showing the operation of the input part of the memory device in FIG. 1. Referring again to FIGS. 1 and 2, when the clock signal generator outputs the synchronous pulse signals /CK1 and /CK2 through the logic circuit, the address pad 1 and the input buffer 2 in the memory device generates the buffered address signal ((a) in FIG. 3) and outputs this signal into the input register 3. In the case where the synchronous pulse signals /CK1 is at a low level, both the PMOS transistor P100 and NMOS transistor N99 are turned on and then the multiplex MUX1 stores the signal (a) in the latch circuit L1.

On the other hand, when the synchronous pulse signal /CK1 is at a high level, the multiplex MUX1 is turned off. At this time, the synchronous pulse signal /CK2 is at a low level and then the multiplex MUX2 is turned on, storing the output ((b) in FIG. 3) of the latch circuit L1 in the latch circuit L2.

Before the synchronous pulse signal /CK1 is at a low level, the synchronous pulse signal /CK2 is at a high level so that the latch circuit L1 is isolated from the latch circuit, L2. Accordingly, the signal ((c) in FIG. 3), address signal A-1, which is stored in the latch circuit L2, is decoded in response to the external clock signal through the decoder 5 so that the word line selector 6 activates the word line coupled to memory cells. Continuously, when the multiplex MUX1 is turned on at a low level of the synchronous pulse signal /CK1, and the multiplex MUX2 is turned off at a high level of the synchronous pulse signal /CK2, the subsequent address signal (AO) is stored in the latch circuit L1.

However, since this sequence needs a timing margin (Tm1.Tm2) to control the timing of the clock signals /CK1 and /CK2, the external clock signal may have a long cycle (Tcyc). As a result, this long cycle is inadequate to transmit data at a high speed

SUMMARY OF THE INVENTION

An object of the present invention is to provide a synchronous memory device capable of processing data at a high speed in a read path of the memory device, by decreasing the timing margin of the external clock signal which is input into the input registers of the pipeline structure.

In accordance with the present invention, there is provided a memory device comprising: a) an address pad receiving an address signal; b) a first input register coupled to the address pad, wherein the first input registers including: 1) a first switching means, coupled to the address pad, wherein the first switching means, is control led by a first control signal; 2) a first latch means for storing the address signal from the first switching means; and 3) a second switching means coupled to the first latch means, wherein the second switching means is controlled by a second control signal, and wherein the second control signal is 180° out of phase from the first control signal; c) a second input register coupled to the first input register in parallel, wherein the second input registers including: 1) a third switching means coupled to the address pad, wherein the third switching means is controlled by the second control signal; 2) a second latch means for storing the address signal from the third switching means; and 3) a fourth switching means coupled to the second latch means, wherein the fourth switching means is controlled by the first; d) an inverting means for output from the second switching means; and e) a decoding means for decoding the output from the inverting means.

In accordance with the present invention, there is provided an input register for transmitting an input data to an internal circuit in response to an external clock signal, the input register comprising: a) a first input register for receiving the input datal through a first path, wherein the first input register includes: 1) a first switching means for receiving the input data; 2) a first storing means for the input signal; and 3) a second switching means, for transmitting the stored input data to the internal circuit, wherein the signal receiving and transmission is selectively carried out by first and second control signals; b) a second input register coupled to the first input register in parallel in order to receive the input signal through a second path, wherein the second input register includes: 1) a third switching means for receiving the input data; 2) a second storing means for the input signal; and 3) a fourth switching means for transmitting the stored input data to the internal circuit, wherein the signal receiving and transmission is selectively carried out by the first and second control signals.

BRIEF DESCRIPTION OF THE DRAWINGS

The above and other objects, advantages and features of the present invention will be more apparent from the following detailed description taken with the attached drawings in which.

DETAILED DESCRIPTION OF THE PREFERRED EMBODIMENT

In the following description, the specific details are set forth to provide a more thorough understanding of the present invention. It will be apparent, however, to one skilled in the art, that the present invention may be practiced without these specific details. In other instances, well known features have not been described in detail so as not to obscure the present invention.

Figure 1:
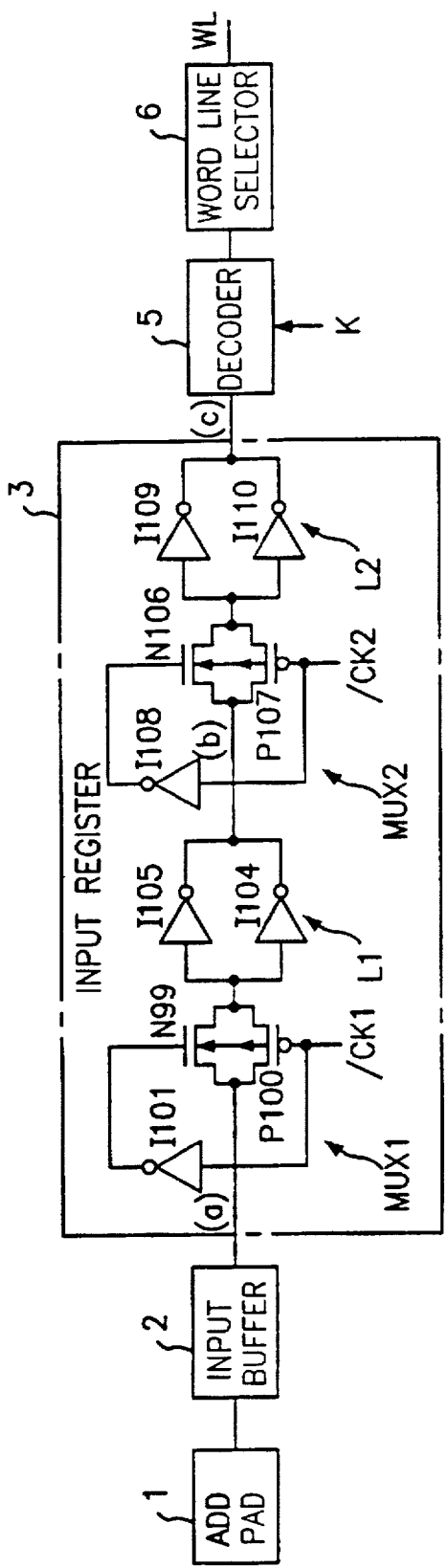
FIG. 1 is a schematic view showing a configuration of an input part of a memory device.
Figure 2:
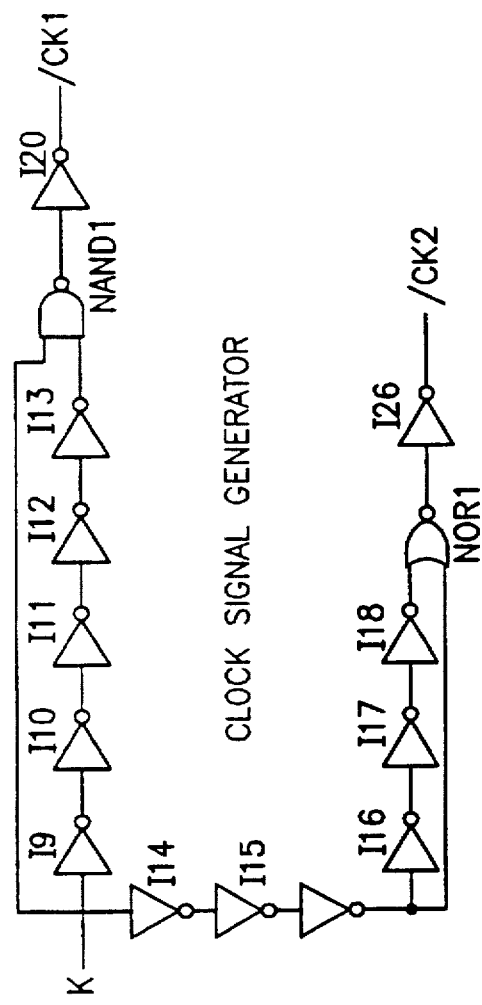
FIG. 2 is a schematic view showing a configuration of a clock signal generator in FIG. 1
Figure 3:
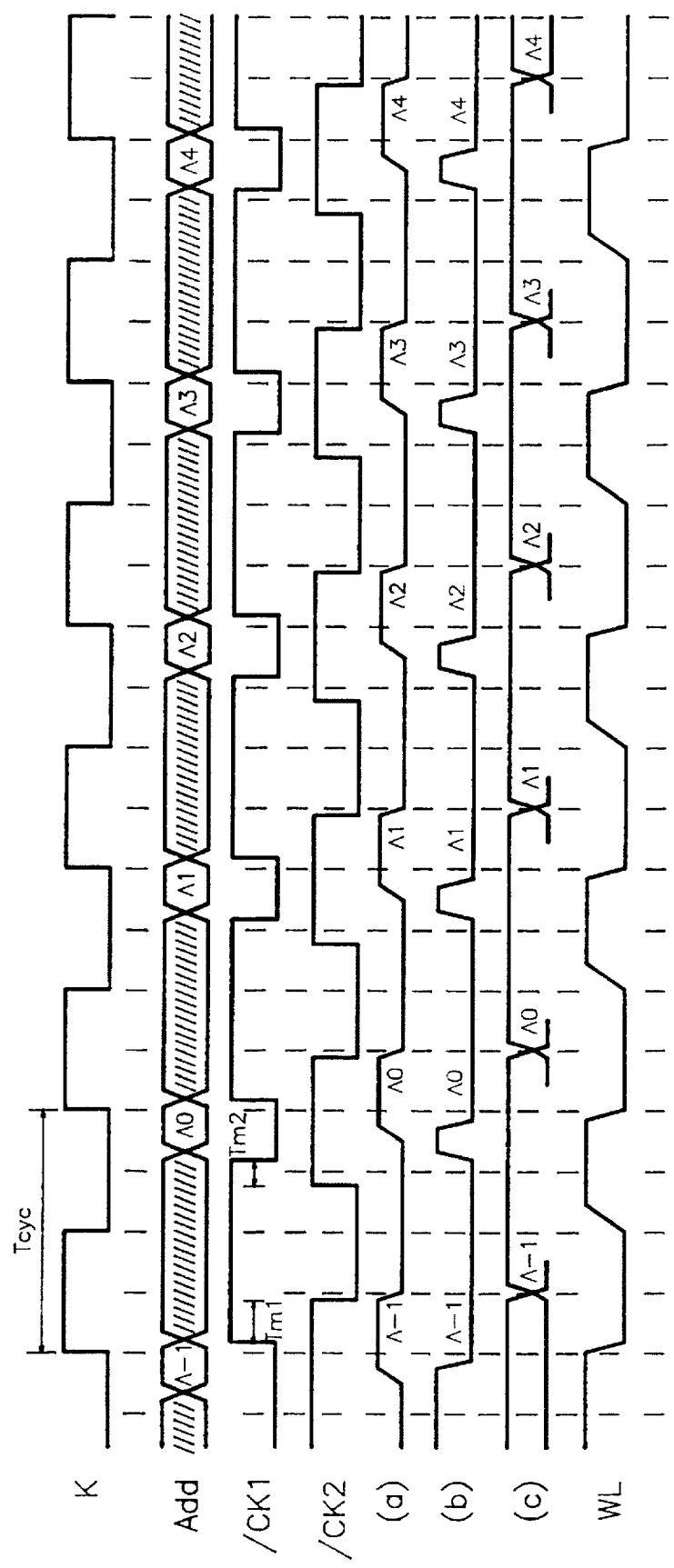
FIG. 3 is a signal waveform chart showing the operation of the input part of the memory device in FIG. 1.
Figure 4:
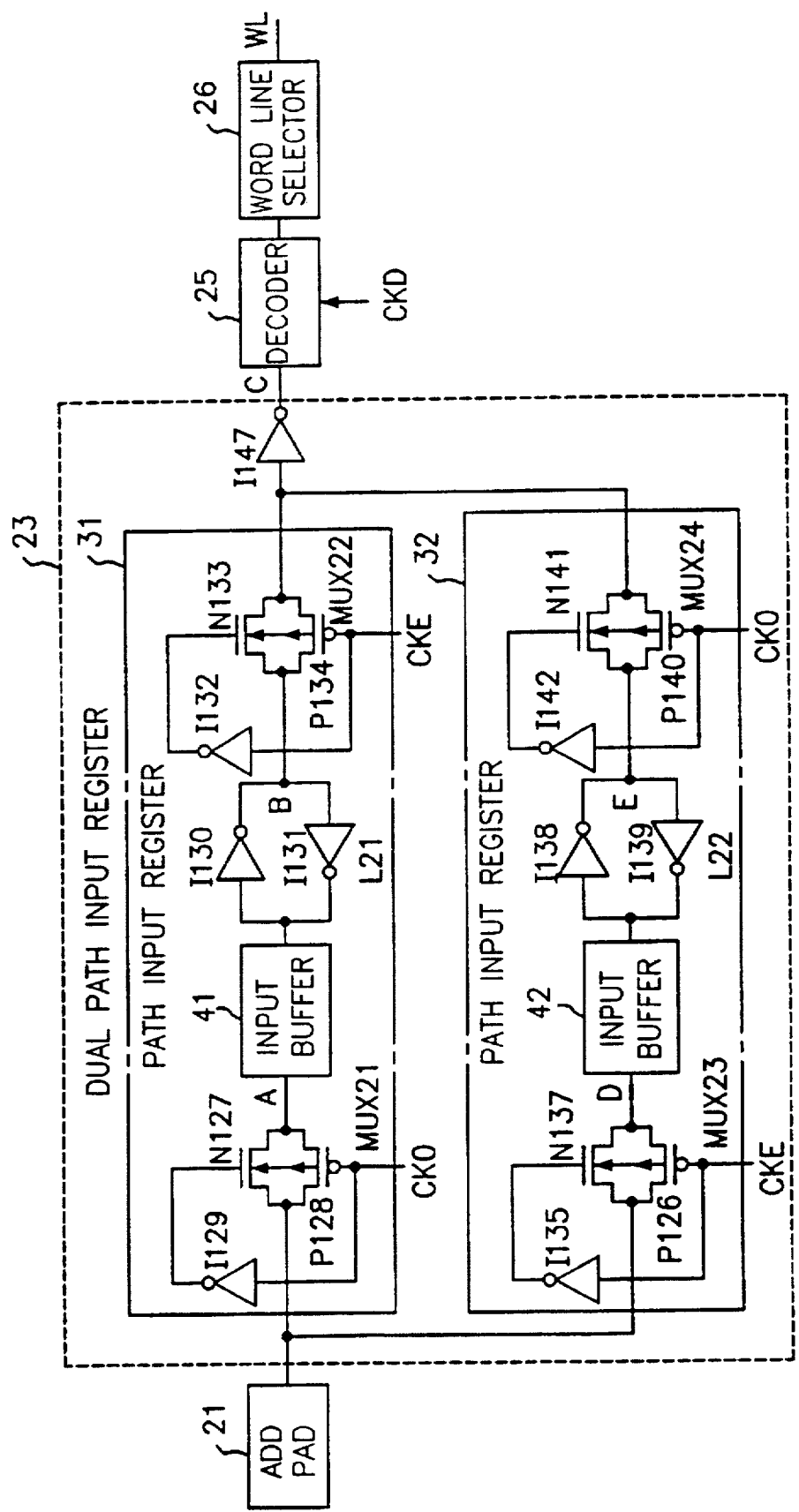
FIG. 4 is a schematic view showing a configuration of an input part of a memory device in accordance with the present invention.

First, FIG. 4 is a schematic view showing a configuration of an input part of a memory device in accordance with the present invention. The input part includes an address (ADD) pad 21 to receive address signal from an external circuit, a dual path input register 23, a decoder 25 and a word line selector 26. The dual path input register 23 is controlled by the two clock pulse signals CKO and CKE. The clock pulse signals CKO and CKE are, respectively, odd pulse signals and even pulse signals of the external clock signal K. The dual path input register 23 includes two path input registers 31 and 32 and an inverter I147.

The path input registers 31 is coupled to the path input registers 32 in parallel. The path input registers 31 includes the multiplexer HUX21 consisting of a PHOS transistor P128 and an NMOS transistor N127 which are, respectively, turned on and off by the odd pulse signal CKO through an inverter I129, and then the address signal is selectively switched to an input buffer 41. The output of the input buffer 41 is stored in a latch circuit L21 having two inverters T130 and 131. The address signal stored in the latch circuit L21 is transmitted to the inverter I147 when a multiplexer NUX22 is turned on by the even pulse signal CKE. Also, the multiplexer MUX22 consisting of a PMOS transistor P134 and an NMOS transistor N133 which are, respectively, turned on and turned off by the odd pulse signal CXE through an inverter I132.

Similarly, the path input register 32, which is coupled to the path input registers 31 in parallel includes the multi-plexer MUX23 consisting of a PMOS transistor P126 and an NMOS transistor N137 which are, respectively, turned on and off by the odd pulse signal CKE through an inverter I135, and then the address signal is selectively switched to an input buffer 42. The output of the input buffer 42 is stored in a latch circuit L22 having two inverters I138 and 139. The address signal stored in the latch circuit L22 is transmitted to the inverter I147 when a multiplexer MUX24 is turned on by the even pulse signal CKO. Also, the multiplexer NUX24 consisting of a PNOS transistor P140 and an NMOS transistor N141 which are, respectively, turned on and turned off by the odd pulse signal CKO through an inverter I142.

Figure 6:
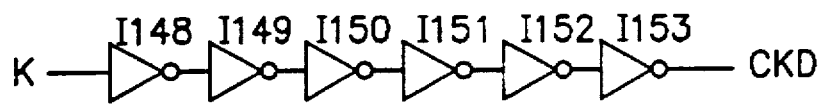
FIG. 6 is a schematic view showing a configuration of a logic circuit for generating a delayed clock signal in FIG. 4.

The decoder 25 decodes the output of the inverter I147 under the control of a delayed clock signal CKD which is generated by a delay means consisting of a plurality of inverters I148 to 153 shown, in FIG. 6. The decoded address signal is input into the word line selector 26 and then a word line is activated to select memory cells.

Figure 5:
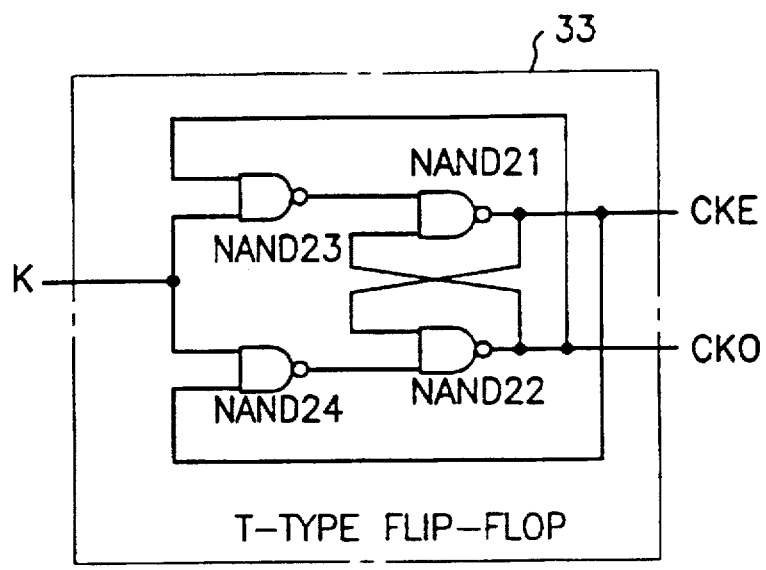
FIG. 5 is a schematic view showing a configuration of the clock signal generator in FIG. 4.

FIG. 5 is a schematic view showing a configuration of the clock signal generator in FIG. 4. As shown in FIG. 5, the odd and even pulse signals controlling the multiplexers MX21 to K24 are generated by a T-type (toggle) flip-flop having a plurality of NAND gates NAND21 to NAND24. The T-type flip-flop generates the even pulse signal CKB and the odd pulse signal CKO according to the even and odd number of the external synchronous clock signal K. It should be noted that this conventional T-type flip-flop is well-known to those skilled in the arts to which the subject matter pertains.

Figure 7:
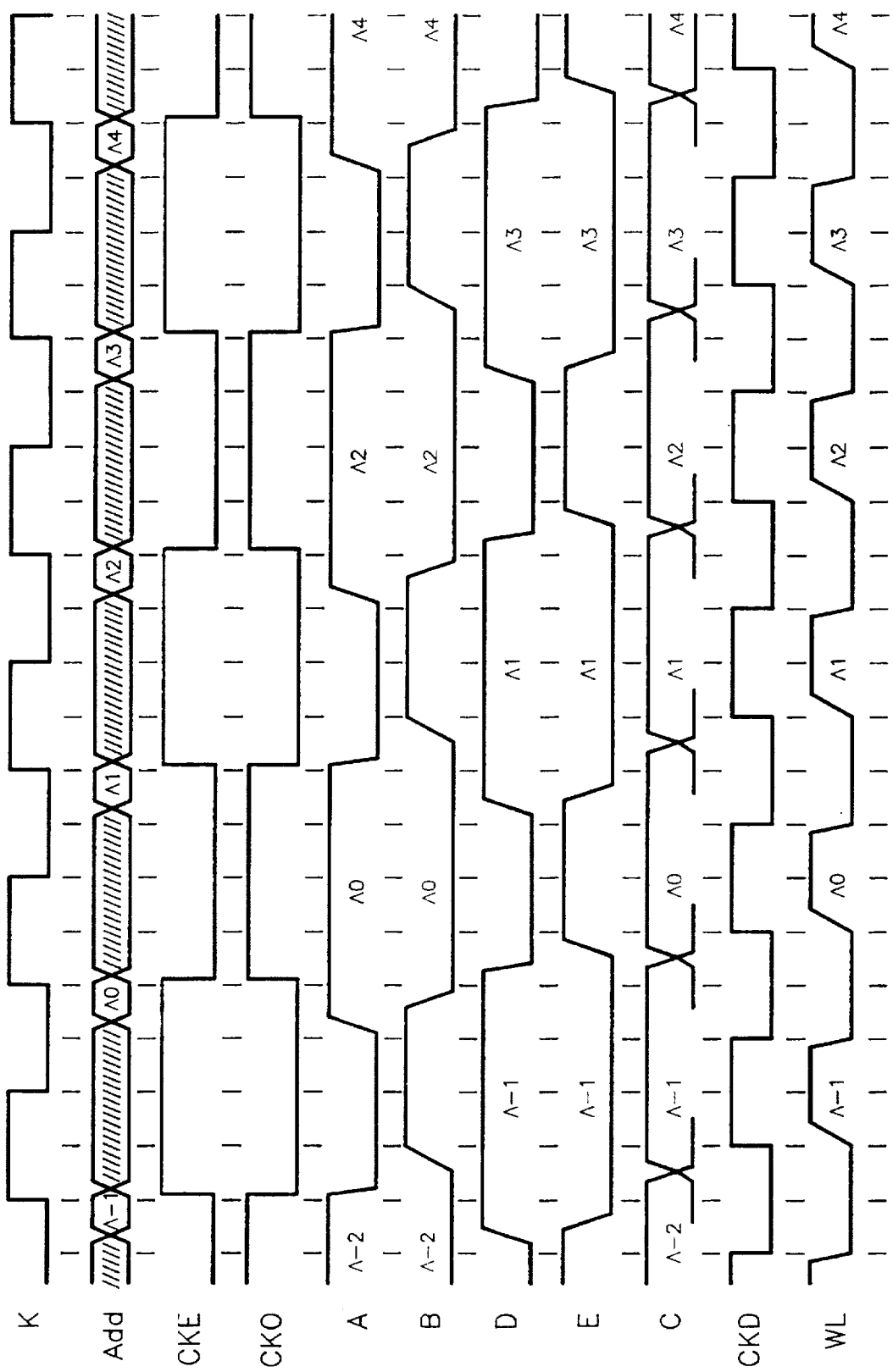
FIG. 7 is a signal waveform chart showing the operation of the input part of the memory device in FIG. 4.

FIG. 7 is a signal waveform chart showing the operation of the input part of the memory device in FIG. 4. First, referring to FIGS. 4 and 7, when the even pulse signal CKE is at a low level, the multiplexer MUX23 is turned on, transmitting the address signal (A-1) to the node D. The address signal (A-1) is stored in the latch circuit L22 through the input buffer 42. At this time, The multiplexer MUX21 is turned off because the odd pulse signal CKO is at a high level, and, accordingly, the address signal (A-2) stored in the latch circuit L21 is transmitted to the decoder through the multiplexer NUX22.

Next, in the case where the number of the pulse of the external synchronous clock signal K is altered, the even pulse signal CKE is at a high level and the multiplexer MUX22 is turned off and then the address signal stored in the latch circuit L21 is not output into the inverter I147.

Due to the transition of the external synchronous clock signal K, the odd pulse signal CKO is at a low level and the multiplexer MUX21 is turn on and then the address signal (A-0) is stored in the latch circuit L21 through the input buffer 41. Further, the multiplexer NUX24 is turned on so that the address signal (A-1) stored in the latch circuit L22 is transmitted to the decoder 25 through the multiplexer MUX24 and the inverter I147.

The address signal transmitted to the decoder 25 is synchronized with the delay clock signal CKD. The word line selector 26 receiving the output from the decoder 25 selects the word line to read data stored in the cells.

As apparent from stated above, since the address read operation is continuously carried out without the timing margin of the external clock signals, the present invention has effects on the improvement of the speed in reading the address signal. Accordingly, the speed of the signal for selecting the word line may be improved up to 25%.

What is claimed is:

1. A memory device comprising:

a) an address pad receiving an address signal;

b) a first input register coupled to the address pad, wherein the first input registers including:

1) a first switching means coupled to the address pad, wherein the first switching means is controlled by a first control signal;
2) a first latch means for storing the address signal from the first switching means; and
3) a second switching means coupled to the first latch means, wherein the second switching means is controlled by a second control signal, and wherein the second control signal is 180° out of phase from the first control signal;

c) a second input register coupled to the first input register in parallel, wherein the second input registers including:
1) a third switching means coupled to the address pad, wherein the third switching means is controlled by the second control signal;
2) a second latch means for storing the address signal, from the third switching means; and
3) a fourth switching means coupled to the second latch means, wherein the fourth switching means is controlled by the first;

d) an inverting means for output from the second switching means; and e) a decoding means for decoding the output from the inverting means.

2. A memory device in accordance with claim 1, wherein the first input registers further comprises a first input buffet means coupled to the first switching means for buffering the address signal, and wherein the second input registers further comprises a second in Put buffer means coupled to the third switching means for buffering the address signal.

3. A memory device in accordance with claim 1, wherein the first and second control signals are generated by a toggle flip-flop receiving an external clock signal.

4. A memory device in accordance with claim 1, wherein the decoding means outputs decoded signal to activate a word line in response to a third control signal.

5. A memory device in accordance with claim 4, wherein the third control signal is generated, by delaying the external clock signal.

6. An input register for transmitting an input data to an internal circuit in response to an external clock signal, the input register comprising:

a) a first input register for receiving the input datal through a first path, wherein the first input register includes:
1) a first switching means for receiving the input data;
2) a first storing means for the input signal; and
3) a second switching means for transmitting the stored input data to the internal circuit, wherein the signal receiving and transmission is selectively carried out by first and second control signals;

b) a second input register coupled to the first input register in parallel in order to receive the input signal through a second path, wherein the second input register includes:
1) a third switching means for receiving the input data;
2) a second storing means for the input signal; and
3) a fourth switching means for transmitting the stored input data to the internal circuit, wherein the signal receiving and transmission is selectively carried out by the first and second control signals.

7. A memory device in accordance with claim 6, whetein the second control signal is 180° out of phase from the first control signal.

8. A memory device in accordance with claim 7, wherein the first and second control signals are generated by a toggle flip-flop receiving an external clock signal.

* * * * *